US012656371B2

(12) United States Patent
Chiu et al.

(10) Patent No.: US 12,656,371 B2
(45) Date of Patent: Jun. 16, 2026

(54) SUPPORTING DEVICE AND PROTECTIVE CASE FOR PROBE CARD

(71) Applicant: Gudeng Precision Industrial Co., Ltd., New Taipei City (TW)

(72) Inventors: Ming-Chien Chiu, New Taipei City (TW); Yung-Chin Pan, New Taipei City (TW); Yu-Chen Chu, New Taipei City (TW); Chi-Chuan Huang, New Taipei City (TW)

(73) Assignee: GUDENG PRECISION INDUSTRIAL CO., LTD., New Taipei City (TW)

( * ) Notice: Subject to any disclaimer, the term of this patent is extended or adjusted under 35 U.S.C. 154(b) by 329 days.

(21) Appl. No.: 18/519,191

(22) Filed: Nov. 27, 2023

(65) Prior Publication Data

US 2024/0369596 A1 Nov. 7, 2024

Related U.S. Application Data

(60) Provisional application No. 63/463,427, filed on May 2, 2023.

(51) Int. Cl.
| | |
|---|---|
| *G01R 1/04* | (2006.01) |
| *G01R 1/067* | (2006.01) |
| *G01R 1/073* | (2006.01) |
| *G01R 31/28* | (2006.01) |

(52) U.S. Cl.
CPC ........... *G01R 1/04* (2013.01); *G01R 1/07342* (2013.01)

(58) Field of Classification Search
CPC .......... G01R 1/04; G01R 1/067; G01R 1/073; G01R 31/28
See application file for complete search history.

(56) References Cited

U.S. PATENT DOCUMENTS

2021/0311095 A1 10/2021 Huang et al.

FOREIGN PATENT DOCUMENTS

| CN | 219625536 | * 9/2023 | ............... G01R 1/04 |
|---|---|---|---|
| JP | 2021-089175 A | 6/2021 | |
| KR | 10-2001-0054178 | 7/2001 | |
| KR | 10-2006-0113067 | 11/2006 | |

* cited by examiner

*Primary Examiner* — Neel D Shah
(74) *Attorney, Agent, or Firm* — WPAT, PC

(57) ABSTRACT

A supporting device and a protective case for a probe card are provided. The protective case includes the supporting device, a case body, an upper cover, and plural switching members. The supporting device has plural quick-release members and plural bevel grooves. The case body has plural arrangement grooves each configured to mate with the corresponding quick-release member to fasten the supporting device to the case body. The probe card is connected with a protecting cover that includes plural fastening members fastened to the probe card. When the protecting cover and the probe card connected therewith are placed on the supporting device, the bevel grooves actuate the fastening members and thereby unfasten the fastening members from the probe card. The switching members are provided on the case body and are each lockable to a corresponding engaging member on the upper cover to lock the upper cover the case body together.

10 Claims, 15 Drawing Sheets

200

173

100

800

830

840

820

SUPPORTING DEVICE AND PROTECTIVE CASE FOR PROBE CARD

RELATED APPLICATIONS

This application claims priority to U.S. Provisional Patent Application, No. U.S. 63/463,427, by CHIU, et al., titled "Probe Card Supporting Device," filed on May 2, 2023, which is hereby incorporated by reference in their entirety.

BACKGROUND OF THE INVENTION

Technical Field

The present invention relates to a protective case for a probe card. More particularly, the present invention relates to a supporting device and a quick-release protective case for a probe card.

Description of Related Art

With the advancement of technology, semiconductor devices have been widely used in a variety of electronic devices. One of the manufacturing processes of a semiconductor device is testing the semiconductor wafer of which the device is made, before the packaging process is performed. As an interface between a semiconductor wafer and a wafer testing system, a probe card is connected between a semiconductor wafer under test and the testing system, and is provided with a plurality of probes each configured to make electrical contact with a solder pad or bump on the wafer under test so that measurement can be carried out through the electrical connection formed between the wafer and the testing system by the probe card.

One known method for protecting the probes on a probe card before use or maintenance is to provide the probe card with a protecting cover. Currently, however, probe cards still have the following deficiencies during testing and maintenance operations as well as during storage. First, as probe cards are moved and handled manually, the probes tend to be damaged by contact or collision that occurs while the probe cards are being picked up and placed. Second, if through negligence, the protecting cover of a probe card is not removed from the probe card during the semiconductor wafer testing process, testing errors will occur, or even the testing apparatus will be damaged.

SUMMARY

In view of the above-mentioned problems, the present invention is to provide a supporting device and a protective case for a probe card. When a protecting cover and the probe card connected therewith are placed on the supporting device, the bevel grooves in the supporting device will actuate the fastening members on the protecting cover such that the fastening members are unfastened from the probe card to allow the probe card and the protecting cover to separate from each other. Thus, the probe card is protected by the protecting cover while being picked up and placed, and the protecting cover is automatically removed when the probe card is gripped by automated equipment. The invention, therefore, not only provides the probes of the probe card with enhanced protection, but also facilitates the automation of relevant testing operations.

According to one aspect of the invention, a protective case for a probe card includes a supporting device and a case body. The supporting device is configured to support and position the probe card. The supporting device has a plurality of quick-release members. The case body is provided with a plurality of arrangement grooves that are arranged to correspond to the quick-release members, and each arrangement groove is configured to mate with the corresponding quick-release member. Each quick-release member is configured to mate with the corresponding arrangement groove in a detachable manner and thereby detachably fasten the supporting device to the case body to dispose the supporting device in the case body.

In one embodiment, the quick-release members are elastic fastening structures, and each quick-release member includes an abutting member configured to abut against an inner wall of the case body and a pair of shoulders each connected to one of two lateral sides of the abutting member. The case body is further provided with a plurality of pressing fasteners each located at one of the arrangement grooves, and each pressing fastener is configured to press against and be fastened to the corresponding pair of shoulders in order to secure the supporting device.

In another embodiment, when the abutting members are each moved a predetermined distance away from the inner wall by an applied force, each pair of shoulders is separated from the corresponding pressing fastener to bring the supporting device into a detachable state.

According to another aspect of the invention, a supporting device for a probe card is provided in a protective case in a detachable manner and has a plurality of bevel grooves. The supporting device is configured to support and position the probe card. The probe card is connected with a protecting cover, and the protecting cover includes a plurality of fastening members configured to be fastened to the probe card. When the protecting cover is placed on the supporting device together with the probe card connected with the protecting cover, the bevel grooves actuate the fastening members such that the fastening members are unfastened from the probe card to allow the probe card and the protecting cover to separate from each other. When the probe card placed on the supporting device is removed by a first means, the probe card is separated from the protecting cover, and the protecting cover is left on the supporting device. When both the protecting cover and the probe card placed on the supporting device are removed by a second means, the fastening members are separated from the bevel grooves and are fastened to the probe card again.

In one embodiment, the protecting cover is further configured to connect with a jig after the protecting cover and the probe card are removed by the second means, and the probe card and the protecting cover are separable by the jig. The jig has a main body, and the main body has two lateral sides each formed as an inclined surface for actuating corresponding ones of the fastening members and thereby unfastening the corresponding ones of the fastening members from the probe card.

In one embodiment, the protecting cover includes a cover body, a sidewall, and a first handle provided on the sidewall. The first handle corresponds to a second handle of the probe card, and the second means is removing the protecting cover and the probe card at the same time by way of the second handle and the first handle.

In another embodiment, each fastening member has a tilted stem, and each bevel groove is configured to interact with the tilted stem of the corresponding fastening member. Each bevel groove has an inclined guide surface forming a first angle with a horizontal plane, and each tilted stem forms a second angle with the horizontal plane, wherein the second angle is smaller than the first angle.

According to yet another aspect of the invention, a protective case for a probe card includes a supporting device, a case body, an upper cover, and a plurality of switching members. The supporting device is configured to support and position the probe card. The supporting device has a plurality of quick-release members. The case body is provided with a plurality of arrangement grooves that arranged to correspond to the quick-release members, and each arrangement groove is configured to mate with the corresponding quick-release member. Each quick-release member is configured to mate with the corresponding arrangement groove in a detachable manner and thereby detachably fasten the supporting device to the case body to dispose the supporting device in the case body. The upper cover and the case body jointly define a receiving space for receiving the supporting device and the probe card. The switching members are provided on the case body, and the upper cover is provided with a plurality of engaging members each corresponding in position to one of the switching members. Each switching member is configured to be locked to the corresponding engaging member and thereby lock the upper cover the case body together.

In one embodiment, each switching member is a rotary elastic fastener and is configured to be pressed by a first means and then turned so as to be unlocked from the corresponding engaging member, thereby bringing the upper cover into a removable state.

In another embodiment, each switching member is a push-type elastic fastener and is configured to be pressed by a second means so as to be unlocked from the corresponding engaging member, thereby bringing the upper cover into a removable state.

According to the disclosure of the embodiments of the invention, the supporting device and protective case disclosed herein for a probe card are so designed that the protecting cover can be unfastened from the probe card by way of the supporting device to allow the probe card to be removed in a rapid and convenient manner. When the probe card is removed from the supporting device in different ways, the protecting cover either separates from the probe card or is refastened to the probe card to not only prevent the probe card from damage by contact or collision when the probe card is manually picked up and placed, but also facilitate the automation of relevant process flows. In addition, the supporting device is detachably provided in the protective case and can be rapidly replaced to match with different types of probe cards, and this provides enhanced flexibility of use. Moreover, the protective case is provided with the switching members and the engaging members to enable automatic locking and unlocking.

BRIEF DESCRIPTION OF DRAWINGS

The invention can be more fully understood by reading the following detailed description of the embodiment, with reference made to the accompanying drawings as follows.

DETAILED DESCRIPTION

Figure 1:
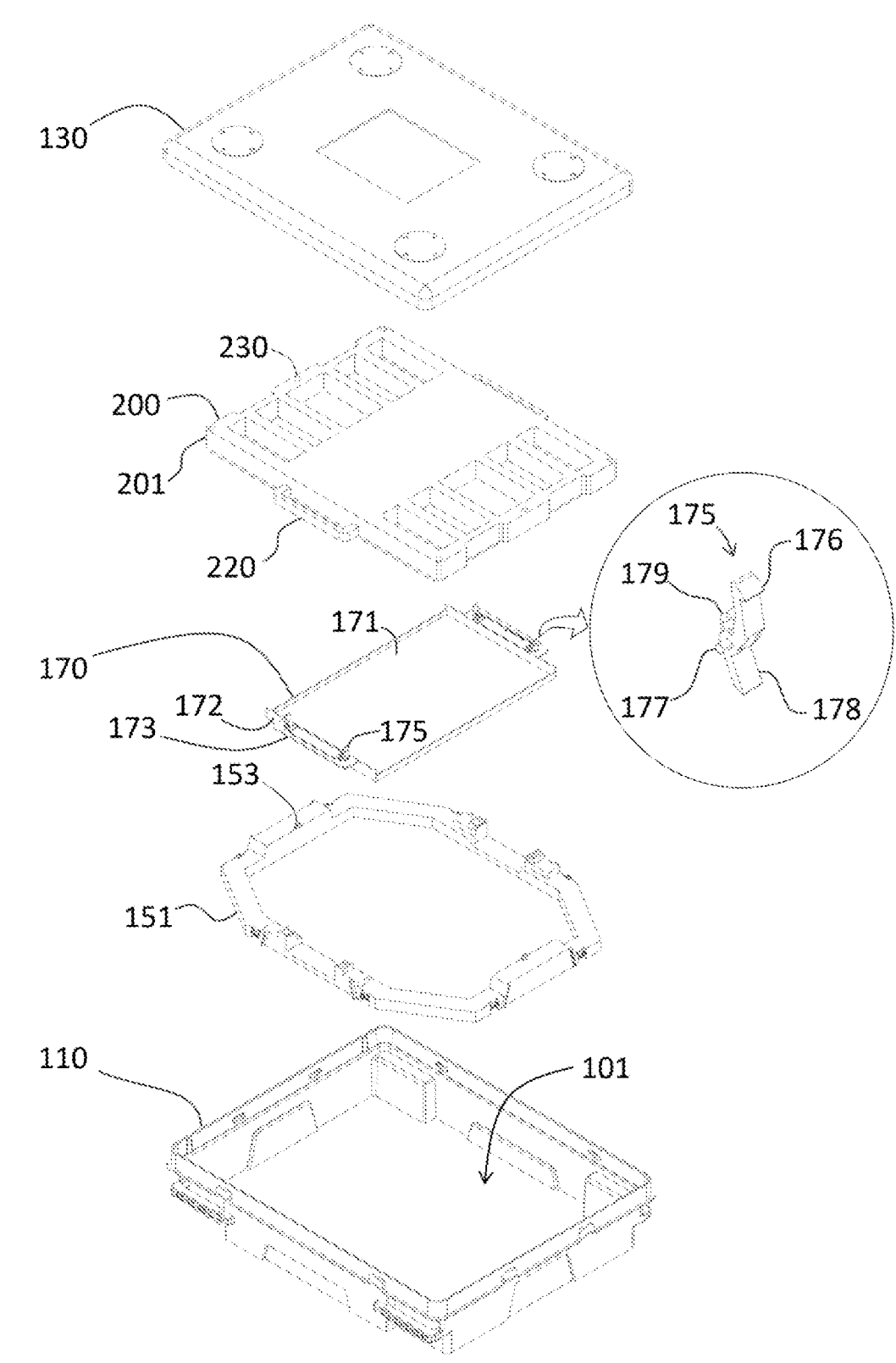
FIG. 1 is an exploded diagram of the protective case according to an embodiment of the invention.
Figure 2A:
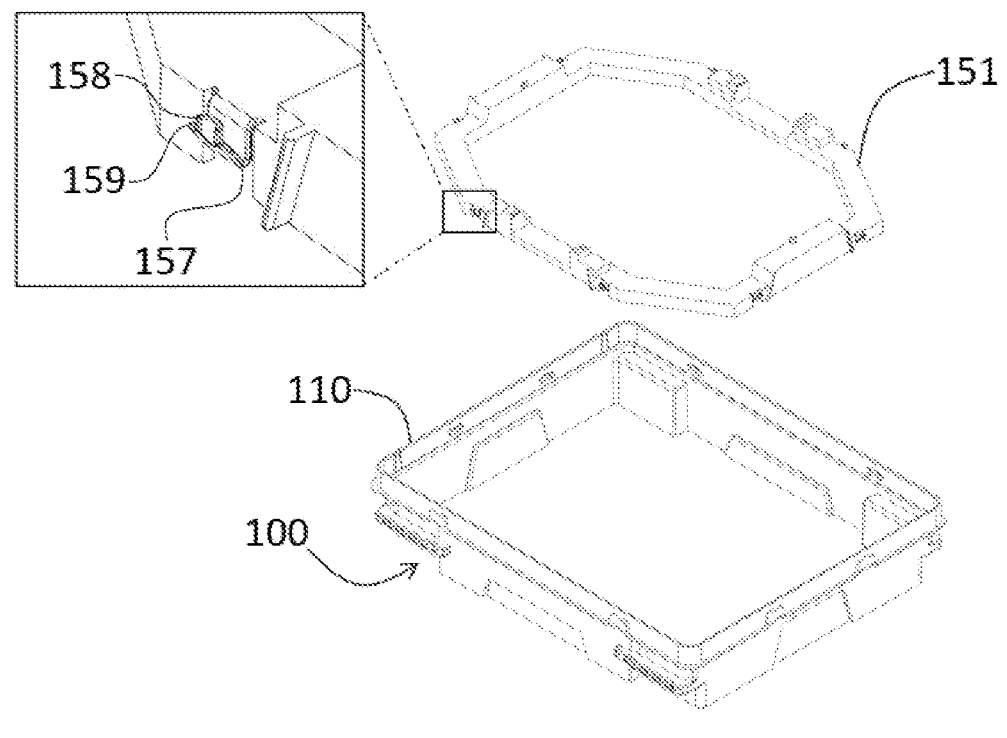
FIG. 2a is a schematic diagram showing a supporting device and a case body before they are put together.
Figure 2B:
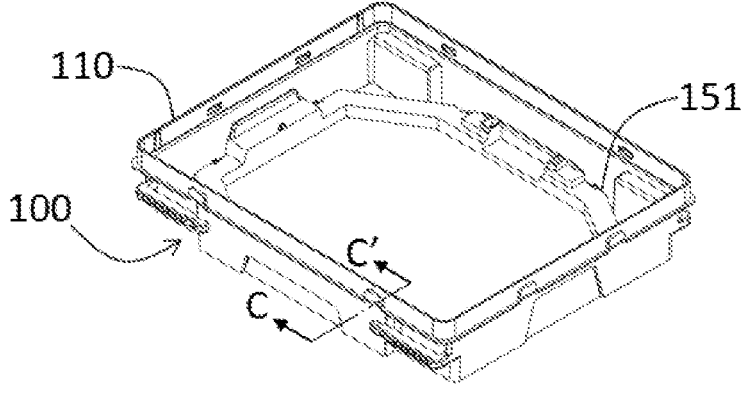
FIG. 2b is a schematic diagram showing the supporting device and the case body in the assembled state.
Figure 2C:
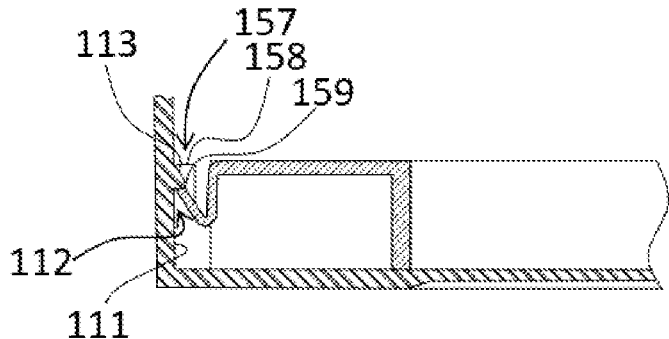
FIG. 2c is a sectional view taken along line C-C' in FIG. 2b.

Please refer to FIG. 1 and FIG. 2a to FIG. 2c, in which: FIG. 1 is an exploded schematic diagram of the protective case according to an embodiment of the present invention, FIG. 2a is a schematic diagram showing a supporting device and a case body before they are put together, FIG. 2b is a schematic diagram showing the supporting device and the case body in the assembled state, and FIG. 2c is a sectional view taken along line C-C' in FIG. 2b. The protective case 100 at least includes a supporting device 151 and a case body 110. The supporting device 151 is configured to support and position a probe card 200, and the supporting device 151 has a plurality of quick-release members 157. The case body 110 is provided with a plurality of arrangement grooves 112 that are arranged to correspond to the quick-release members 157, and each arrangement groove 112 is configured to mate with the corresponding quick-release members 157. Each quick-release member 157 is configured to mate with the corresponding arrangement groove 112 in a detachable manner and thereby detachably fasten the supporting device 151 to the case body 110 and to dispose the supporting device 151 in the case body 110.

In this embodiment, the quick-release members 157 each has an elastic fastening structure, and each quick-release member 157 includes an abutting member 158 and a pair of shoulders 159. Each abutting member 158 is configured to abut against an inner wall 111 of the case body 110, and each pair of shoulders 159 are connected to two lateral sides of the corresponding abutting member 158. The case body 110 is further provided with a plurality of pressing fasteners 113 each located at one of the arrangement grooves 112, and each pressing fastener 113 is configured to press against and be fastened to the corresponding pair of shoulders 159 to thereby secure the supporting device 151. Each abutting member 158 has elastic tolerance for elastic compression and release, and when the abutting members 158 are each moved a predetermined distance away from the inner wall 111 by an applied force, each pair of shoulders 159 is separated from the corresponding pressing fastener 113 to bring the supporting device 151 into a detachable state, in which the supporting device 151 can be rapidly replaced in order to match with different types of probe cards 200.

In this embodiment, eight quick-release members 157 are provided by way of example, but as a person skilled in the art would understand, the number of the quick-release members 157 is not limited to eight. Moreover, the structure of the quick-release members 157 in this embodiment is for illustrative purposes only; any structure that allows the supporting device 151 to be provided in the protective case 100 in a detachable manner can be used in the present invention.

Figure 3A:
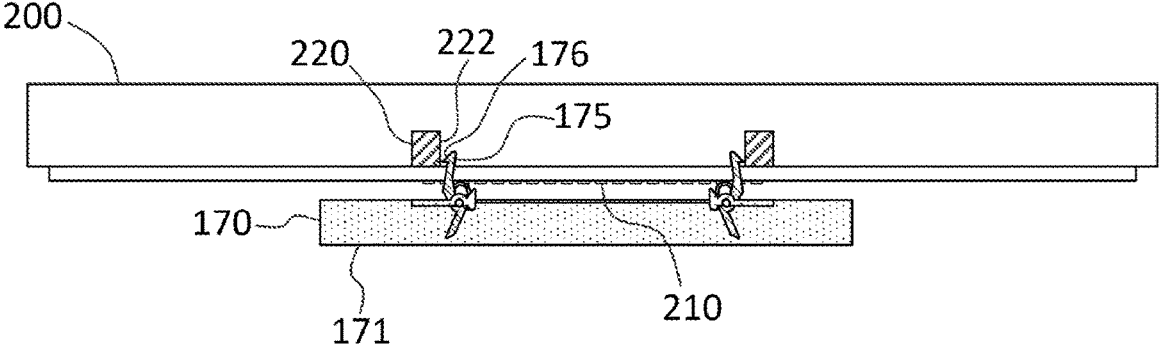
FIG. 3a is a sectional side view showing a probe card and a protecting cover before they are connected together.
Figure 3B:
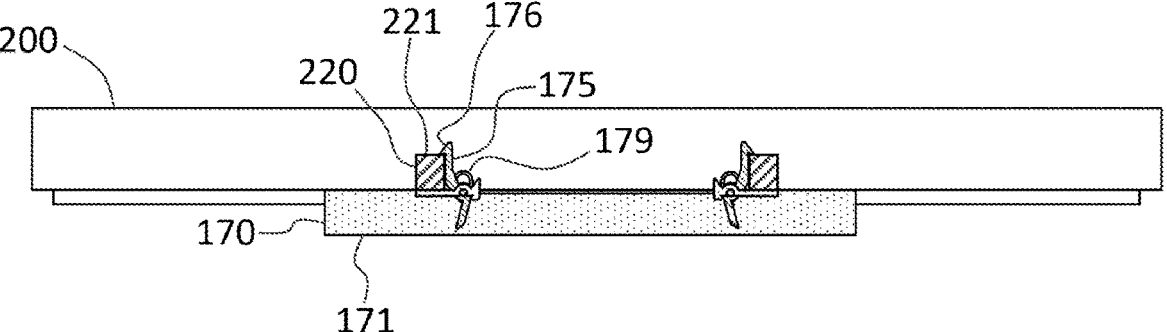
FIG. 3b is a sectional side view showing the probe card and the protecting cover in the connected state.
Figure 4A:
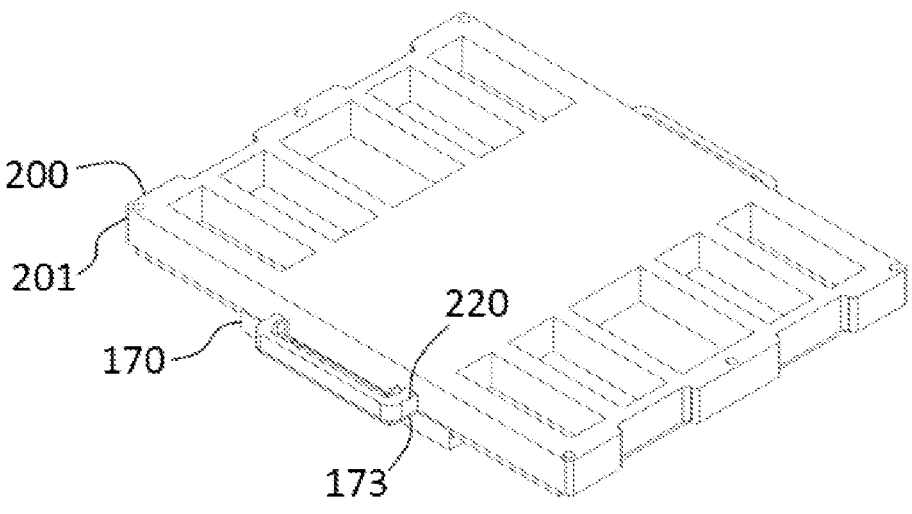
FIG. 4a is a schematic diagram showing the probe card and the protecting cover in the connected state.
Figure 4B:
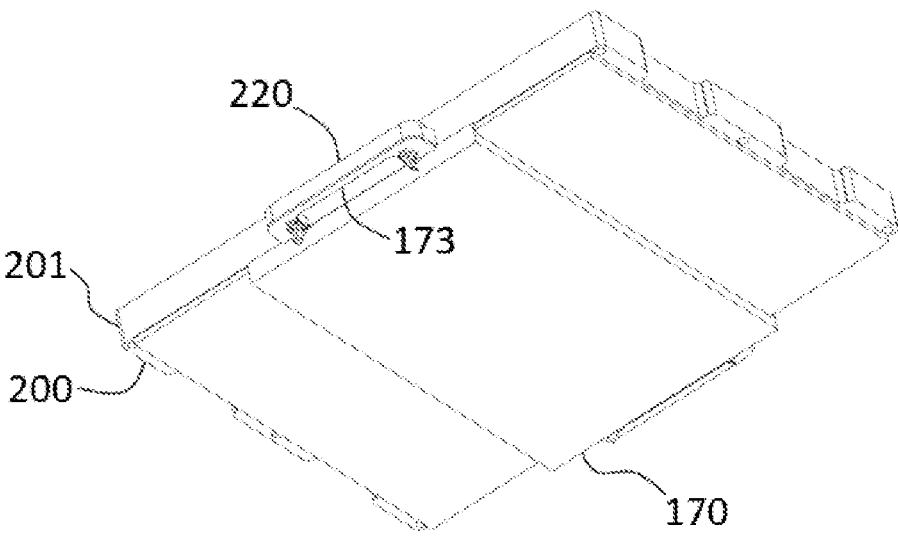
FIG. 4b is a schematic diagram showing the connected probe card and protecting cover in FIG. 4a from a different viewing angle.
Figure 5A:
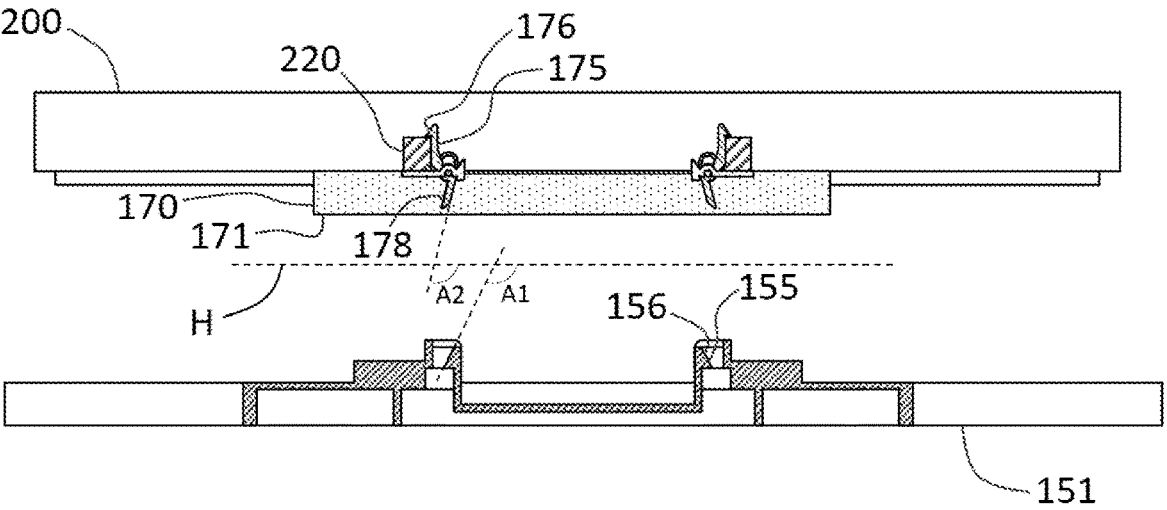
FIG. 5a is a sectional side view showing the probe card and the protecting cover before they are placed on the supporting device.
Figure 5B:
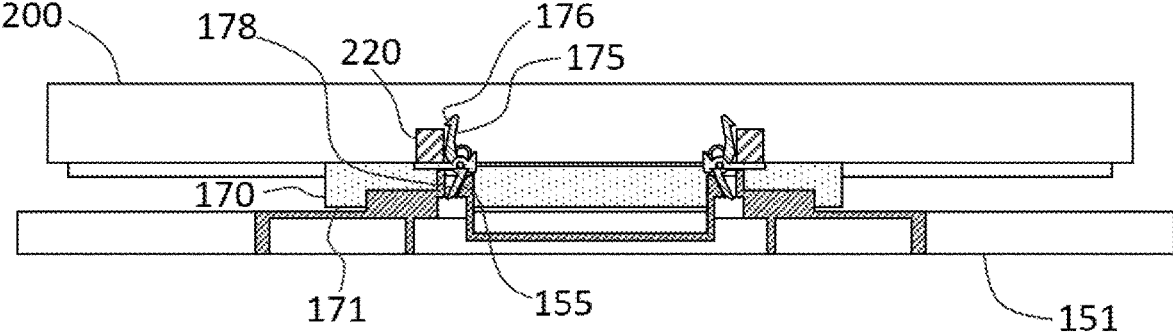
FIG. 5b is a sectional side view showing the probe card and the protecting cover after they are placed on the supporting device.

Please refer to FIG. 3a to FIG. 5b in conjunction with FIG. 1, in which: FIG. 3a is a sectional side view showing a probe card and a protecting cover before they are connected together, FIG. 3b is a sectional side view showing the probe card and the protecting cover in the connected state, FIG. 4a is a schematic diagram showing the probe card and the protecting cover in the connected state, FIG. 4b is a schematic diagram showing the connected probe card and protecting cover in FIG. 4a from a different viewing angle, FIG. 5a is a sectional side view showing the probe card and the protecting cover before they are placed on the supporting device, and FIG. 5b is a sectional side view showing the probe card and the protecting cover after they are placed on the supporting device.

The protective case 100 in this embodiment is configured to receive the probe card 200. The protective case 100 includes the case body 110, an upper cover 130, the supporting device 151, and a protecting cover 170. The upper cover 130 and the case body 110 jointly define a receiving space 101 for receiving the supporting device 151 and the probe card 200. The supporting device 151 is provided in the receiving space 101 of the case body 110, and the supporting device 151 has a plurality of bevel grooves 155 facing the upper cover 130. The supporting device 151 is configured to support and position the probe card 200. The protecting cover 170 includes a cover body 171 and a plurality of fastening members 175 provided on the cover body 171. The cover body 171 is configured to cover the plural probes 210 on the probe card 200 and thereby protect the probes 210 from inadvertent contact or collision. The fastening members 175 are configured to be fastened to the probe card 200. When the protecting cover 170 and the probe card 200 connected therewith are jointly placed on the supporting device 151, the bevel grooves 155 actuate the fastening members 175 and thereby unfasten the fastening members 175 from the probe card 200 such that the probe card 200 and the protecting cover 170 enter a state in which they can be separated from each other, i.e., the state shown in FIG. 5b.

The mutually fastening structural features among the protecting cover 170, the probe card 200, and the supporting device 151 are detailed as follows.

Each fastening member 175 of the protecting cover 170 is a member to be actuated in a rotating manner and has an engaging hook portion 176, an actuating shaft 177, and a tilted stem 178, wherein the engaging hook portion 176 and the tilted stem 178 are connected to two opposite sides of the actuating shaft 177. Each fastening member 157 is rotatably provided on the cover body 171 through the corresponding actuating shaft 177. Each engaging hook portion 176 is configured to be fastened to the probe card 200, and each tilted stem 178 is configured to interact with the corresponding bevel groove 155 of the supporting device 151. When each tilted stem 178 is pushed by a wall of the corresponding bevel groove 155, the corresponding fastening member 175 is rotated through an angle about the corresponding actuating shaft 177 to unfasten the corresponding engaging hook portion 176 from the probe card 200. The probe card 200 has a second handle 220 by which the probe card 200 can be gripped either manually or with a robotic arm. The second handle 220 is provided on a lateral side 201 of the probe card 200. In this embodiment, the engaging hook portion 176 is configured to be fastened to the second handle 220 and thereby connect the protecting cover 170 to the probe card 200.

Each fastening member 175 may further include an elastic curved portion 179 located between the fastening member 175 and the cover body 171 of the protecting cover 170 so that when each fastening member 175 is rotated by an applied force, the corresponding elastic curved portion 179 will be compressed, and when the force acting on the fastening member 175 is removed, the corresponding elastic cured portion 179 will return to its original position elastically and thereby push the fastening member 175 back to its position prior to the rotation.

In the course in which the protecting cover 170 is connecting to the probe card 200, as shown in FIG. 3a, the engaging hook portion 176 is pushed by, and moved along, the inner wall 222 of the corresponding second handle 220. Also, the elastic curved portion 179 is compressed such that the corresponding engaging hook portion 176 is allowed to move past the inner wall 222 of the corresponding second handle 220, and once the engaging hook portion 176 reaches the top side 221 of the corresponding second handle 220, the corresponding elastic curved portion 179 will be elastically released, thereby fastening the engaging hook portion 176 to the top side 221 of the second handle 220. In consequence, the protecting cover 170 is connected to the probe card 200 as shown in FIG. 3b, FIG. 4a, and FIG. 4b. The probes 210 in this state are protected by the cover body 171 of the protecting cover 170 and are therefore kept from damage by contact or collision while the probe card 200 is being moved, and this is advantageous to various picking and moving operations of the probe card 200.

Referring to FIG. 5a, when it is desired to place the protecting cover 170 and the probe card 200 connected therewith on the supporting device 151, it is required for the protecting cover 170 to face the supporting device 151, with each fastening member 175 of the protecting cover 170 in alignment with the corresponding bevel groove 155 of the supporting device 151. More specifically, the tilted stem 178 of each fastening member 175 is made to face the supporting device 151 and align with the corresponding bevel groove 155, and then the protecting cover 170 and the probe card 200 are moved toward the supporting device 151 such that the inclined wall of each bevel groove 155 contacts, and consequently pushes, the corresponding tilted stem 178. Each bevel groove 155 has an inclined guide surface 156 that forms a first angle A1 with a horizontal plane H, and each tilted stem 178 forms a second angle A2 with the horizontal plane H, wherein the second angle A2 is smaller than the first angle A1. In one embodiment, the first angle A1 is 115 degrees, and the second angle A2 is 105 degrees. When each bevel groove 155 (or the inclined guide surface 156 thereof, to be exact) and the corresponding tilted stem 178 interact with, i.e., are pushed by, each other, the corresponding tilted stem 178, which is subjected to the pushing force, drives the corresponding actuating shaft 177 to rotate until the corresponding tilted stem 178 reaches the same inclination angle as the inclined guide surface 156, at which time the corresponding fastening member 175 has been rotated through 10 degrees. During the process, each engaging hook portion 176 is rotated about the corresponding actuating shaft 177 and thus separates from the top side 221 of the second handle 220 to unfasten the protecting cover 170 from the probe card 200, thereby bringing the probe card 200 and the protecting cover 170 into a state in which they can be separated from each other, as shown in FIG. 5b. It is worth noting that the angle through which each fastening member 175 is rotated can be adjusted according to practical needs and is not limited to that stated above; any mechanism design capable of unfastening the engaging hook portion 176 from the second handle 220 and thus forming a predetermined gap (e.g., a 5 mm gap) between each engaging hook portion 176 and the second handle 220 can be used in the present invention.

Figure 6A:
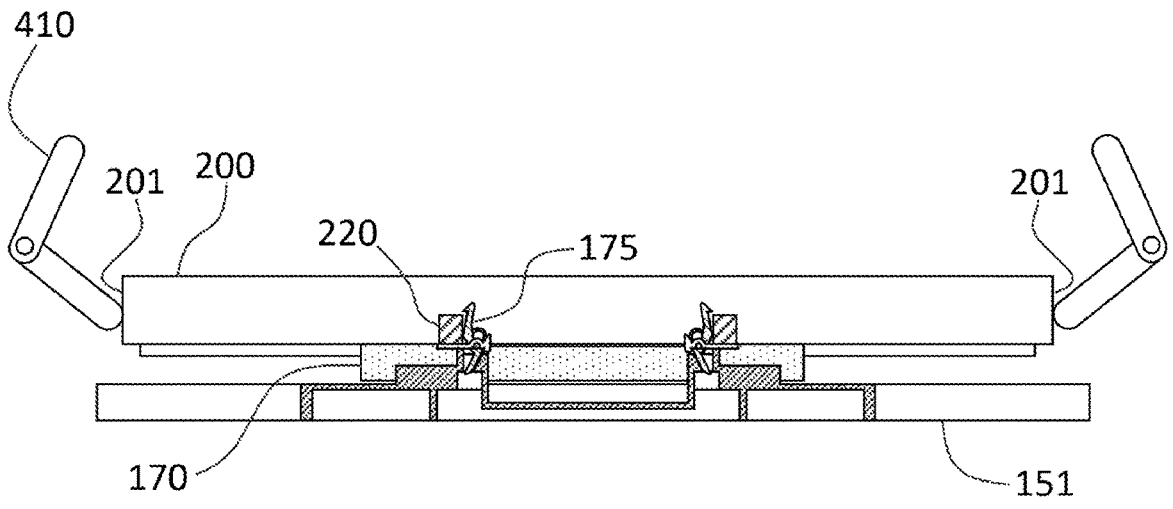
FIG. 6a is a sectional side view showing the probe card being removed by a first means.
Figure 6B:
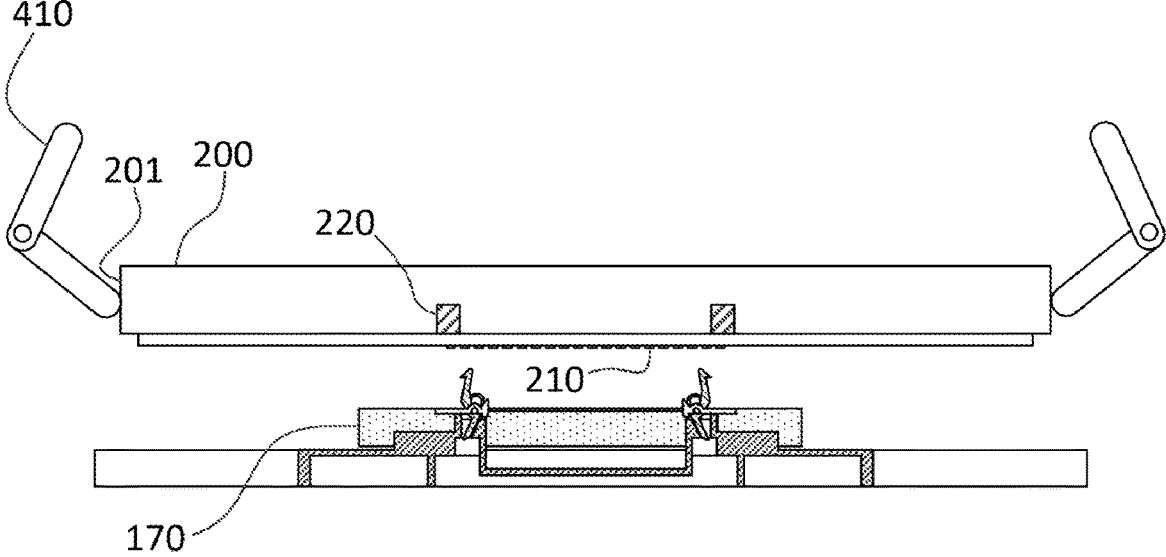
FIG. 6b is a sectional side view showing that the probe card has been removed by the first means.

Please refer to FIG. 6a and FIG. 6b, in which: FIG. 6a is a sectional side view showing the probe card being removed by a first means, and FIG. 6b is a sectional side view showing that the probe card has been removed by the first means. In this embodiment, the first means 410 is a robotic arm that grips the probe card 200 by the two opposite lateral sides 201 of the probe card 200. As the probe card 200 and the protecting cover 170 are now in a state in which they can be separated from each other, removing the probe card 200 on the supporting device 151 by the first means 410 will separate the probe card 200 from the protecting cover 170 and leave the protecting cover 170 on the supporting device 151. After gripping with the robotic arm, therefore, only the probe card 200 is removed from the supporting device 151 to expose the probes 210. The probe card 200 can then be moved to a testing platform in order to perform a test. While the first means 410 in this embodiment entails a robotic arm gripping the probe card 200 by the two opposite lateral sides 201 by way of example, the present invention has no limitation on the portions by which the probe card 200 should be gripped. The robotic arm may grip the probe card 200 by the four corners of the probe card 200 instead. In fact, any technical means capable of gripping the probe card 200 by portions other than the second handle 220 and separating the probe card 200 from the protecting cover 170 can be used in the invention.

Figure 7:
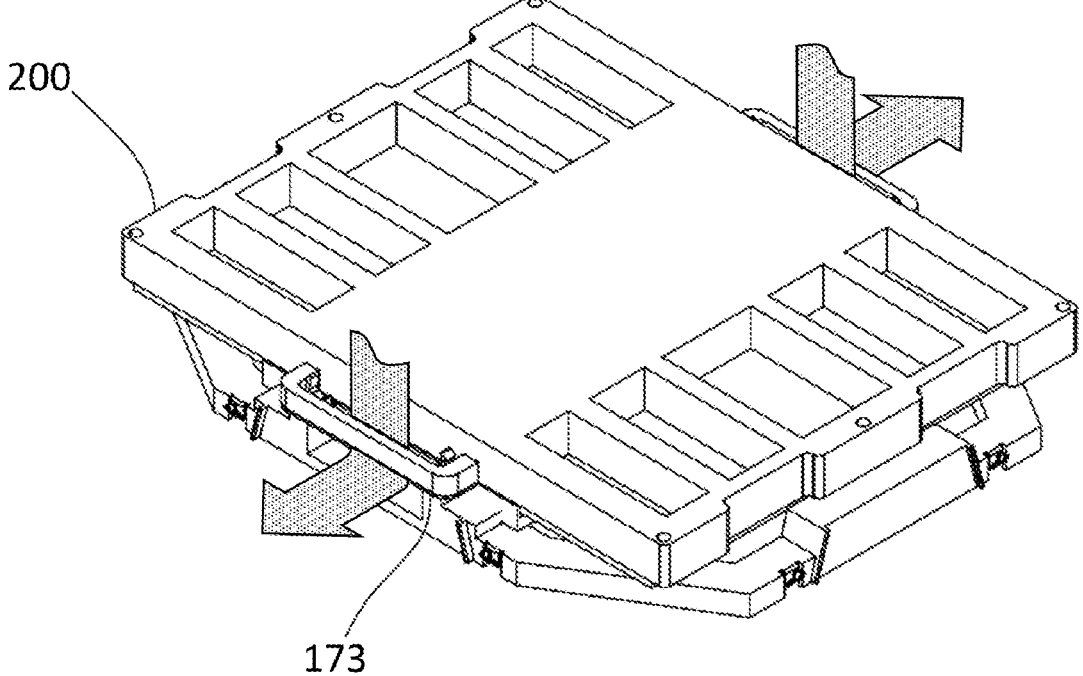
FIG. 7 is a schematic diagram showing gripping by a second means.
Figure 8A:
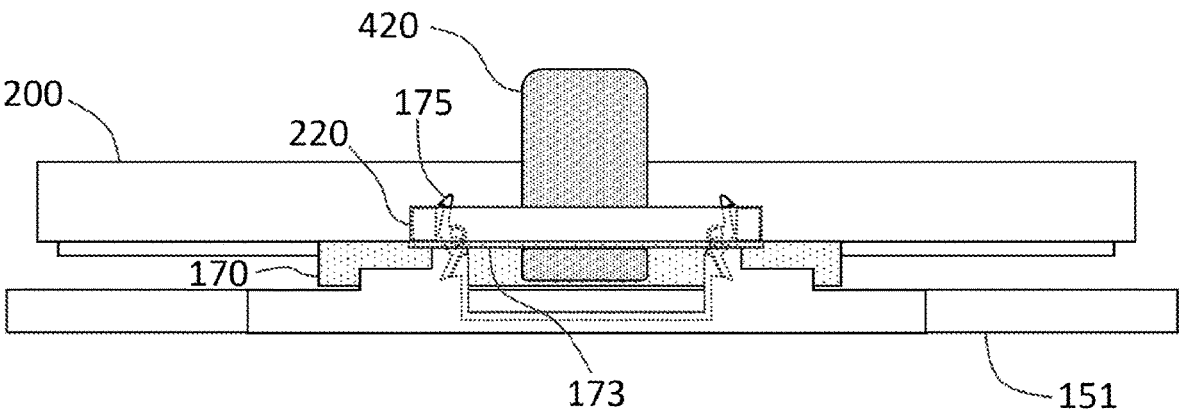
FIG. 8a is a side view showing the protecting cover and the probe card being removed by the second means.
Figure 8B:
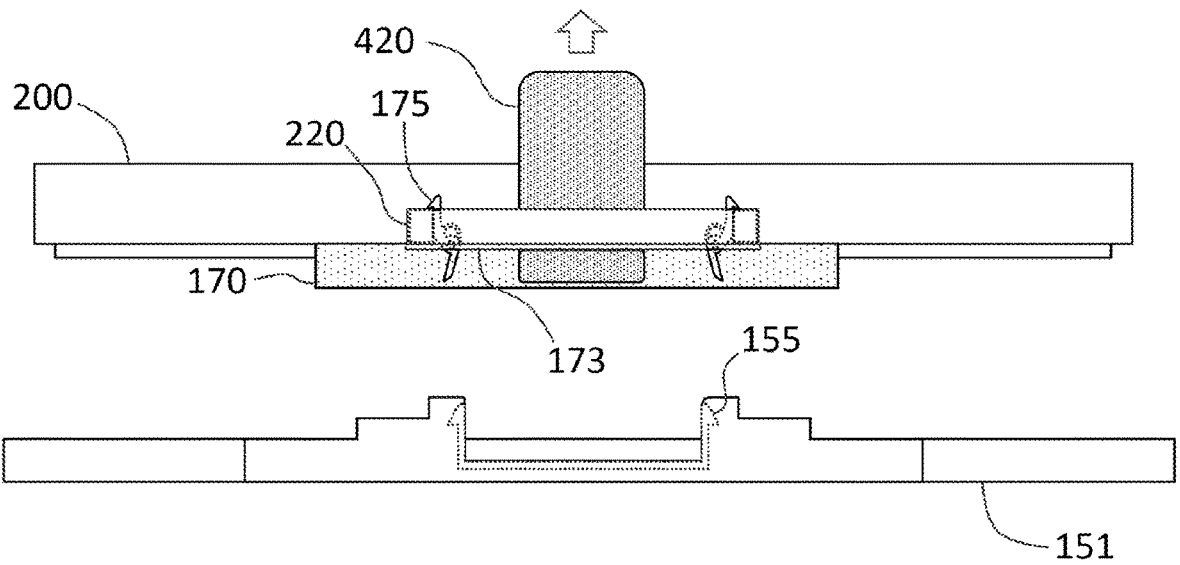
FIG. 8b is a side view showing that the protecting cover and the probe card have been removed by the second means.

Please refer to FIG. 7 to FIG. 8b, in which: FIG. 7 is a schematic diagram showing gripping by a second means, FIG. 8a is a side view showing the protecting cover and the probe card being removed by the second means, and FIG. 8b is a side view showing that the protecting cover and the probe card have been removed by the second means. The arrows in FIG. 7 indicate the way in which the protecting cover and the probe card are gripped by the second means. In this embodiment, the protecting cover 170 includes the cover body 171, a sidewall 172, and a first handle 173 provided on the sidewall 172, as shown in FIG. 1. The first handle 173 corresponds to the second handle 220 of the probe card 200. The second means 420 entails an operator making a manual insertion through the second handle 220 of the probe card 220 into the first handle 173 of the protecting cover 170 and removing the protecting cover 170 and the probe card 200 at the same time. In this embodiment, the first handle 173 protrudes from the sidewall 172 of the cover body 171, and the first handle 173 has the same shape as the second handle 220 of the probe card 200. When the protecting cover 170 is connected to the probe card 200, the first handle 173 is located under and overlapped by the second handle 220 (as shown in FIG. 4a and FIG. 4b) to enable simultaneous removal of the protecting cover 170 and the probe card 200. When both the protecting cover 170 and the probe card 200 on the supporting device 151 are removed by the second means 420, the fastening member 175 is separated from the corresponding bevel groove 155. During the process, the inclination angle of each tilted stem 178 is gradually reduced as the tilted stem 178 moves along the inclined guide surface 156 of the corresponding bevel groove 155, and each engaging hook portion 176 will eventually be fastened to the top side 221 of the corresponding second handle 220 due to rotation of the corresponding actuating shaft 177 such that the protecting cover 170 is brought back to the state in which it is fastened to the probe card 200. Once jointly removed from the supporting device 151, the protecting cover 170 and the probe card 200 can be moved to a maintenance station to go through subsequent operations. While the second means 420 in this embodiment involves manually gripping the first handle 173 and the second handle 220 at the same time by way of example, the second means in the present invention is not necessarily so designed; any technical means capable of simultaneously gripping the protecting cover 170 and the probe card 200 can be used in the invention.

Figure 9A:
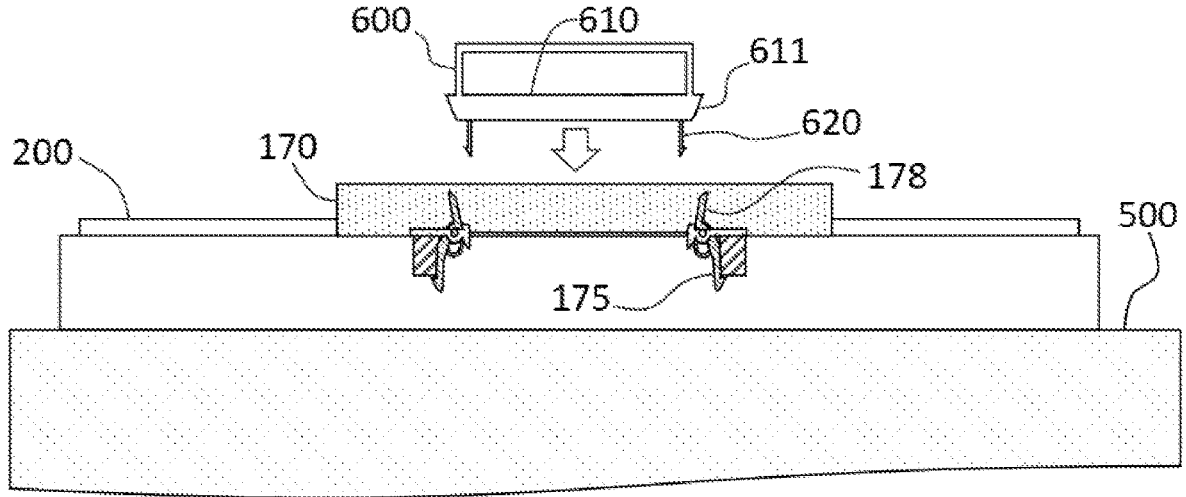
FIG. 9a is a sectional side view showing the protecting cover before it is removed with a jig.
Figure 9B:
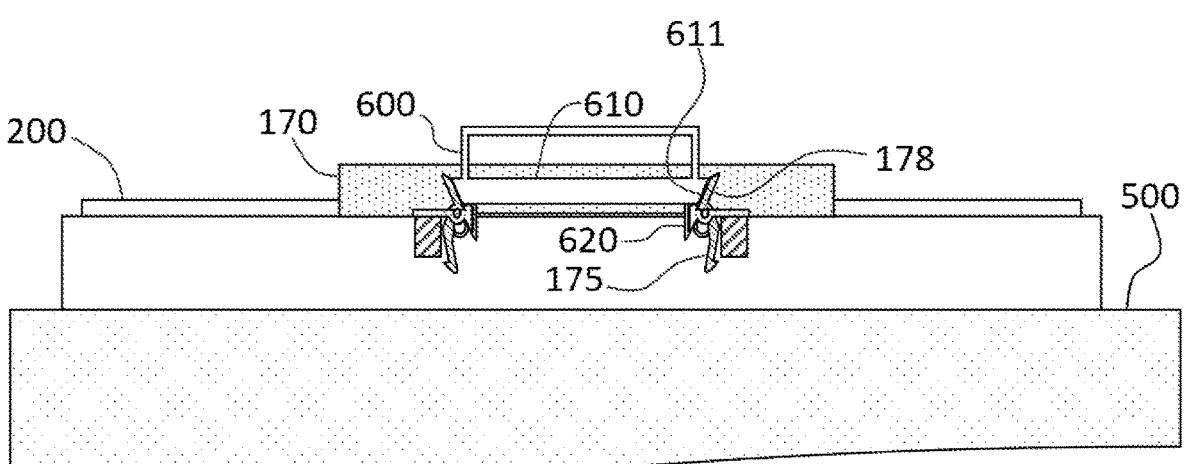
FIG. 9b is a sectional side view showing the jig connected to the protecting cover.
Figure 9C:
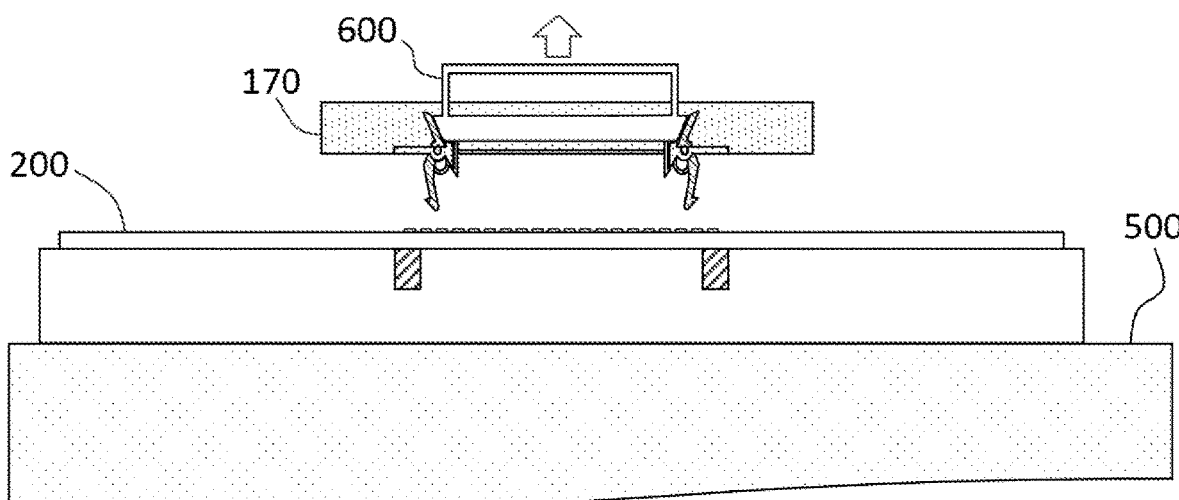
FIG. 9c is a sectional side view showing that the protecting cover has been removed with the jig.

Please refer to FIG. 9a to FIG. 9c, in which: FIG. 9a is a sectional side view showing the protecting cover before it is removed with a jig, FIG. 9b is a sectional side view showing the jig connected to the protecting cover, and FIG. 9c is a sectional side view showing that the protecting cover has been removed with the jig. Once the protecting cover 170 and the probe card 200 are removed by the second means 420, they can be placed upside down on a workbench 500, with the protecting cover 170 and the probes 210 facing away from the workbench 500, and then a jig 600 can be used to separate the protecting cover 170 from the probe card 200. The jig 600 is configured to connect with the protecting cover 170 and has a main body 610 and a pair of fastening legs 620. The main body 610 has two lateral sides each formed as an inclined surface 611 configured to interact with, or push, the tilted stems 178 of the corresponding fastening members 175. The fastening legs 620 are configured to be fastened to the protecting cover 170. In the course in which the jig 600 is connected to the protecting cover 170, the inclined surfaces 611 push the tilted stems 176 and thereby actuate the fastening members 175; as a result, the engaging hook portions 176 are unfastened from the probe card 200. The structures and working mechanism involved in the foregoing operation are the same as those related to the bevel grooves 155 of the supporting device 151 and therefore will not be described repeatedly. Once the jig 600 is connected with the protecting cover 170, the fastening legs 620 are fastened to the protecting cover 170, so when the jig 600 is manually lifted (or lifted with a robotic arm), the protecting cover 170 will be separated from the probe card 200, allowing such operations as cleaning and maintenance to be performed on the probe card 200.

The way in which the probe card 200 in this embodiment is positioned on the supporting device 151 is detailed below with reference to FIG. 1. The probe card 200 has at least one positioning hole 230 configured to work with the at least one positioning structure 153 on the supporting device 151. The positioning structure 153 is, for example, a protruding post. When the probe card 200 is placed on the supporting device 151 in the correct direction, the positioning structure 153 is inserted into the positioning hole 230 to produce a direction-limiting effect. In this embodiment, two positioning holes 230 are symmetrically provided, each at one of two opposite sides of the probe card 200; in a different embodiment, however, the number of the positioning hole(s) 230 at each of the two opposite sides of the probe card 200 may be differently set. For example, there may be one positioning hole 230 at one side of the probe card 230 and two positioning holes 230 at the other side. An asymmetric arrangement of the positioning holes and positioning structures can produce an even better direction-limiting effect. The second handle 220 of the probe card 200 may also serve as a technical means for achieving positioning and direction-limiting purposes. In one embodiment, the second handles 220 on two opposite sides of the probe card 200 are different in size or shape so that the direction of the probe card 200 can be identified with ease. In practice, the positioning holes 230 and the second handle 220 may work together to position and limit the direction of the probe card 200, and the objective of placing the probe card 200 on the supporting device 151 correctly can be achieved.

The mutual actuation mechanisms among the protecting cover 170, the supporting device 151, the probe card 200, and the jig 600 have been described above.

Figure 10:
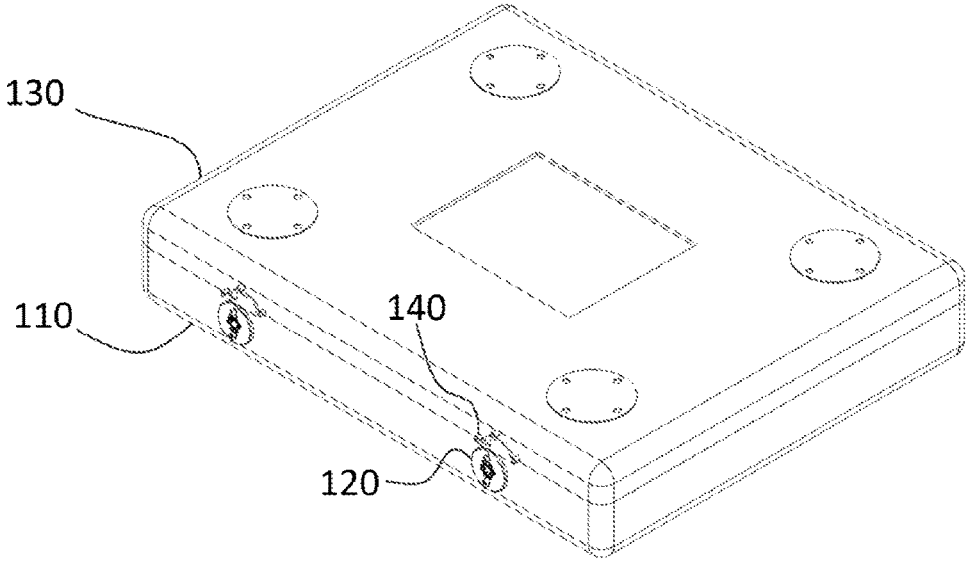
FIG. 10 is a schematic diagram of the protective case according to another embodiment of the invention.
Figure 11:
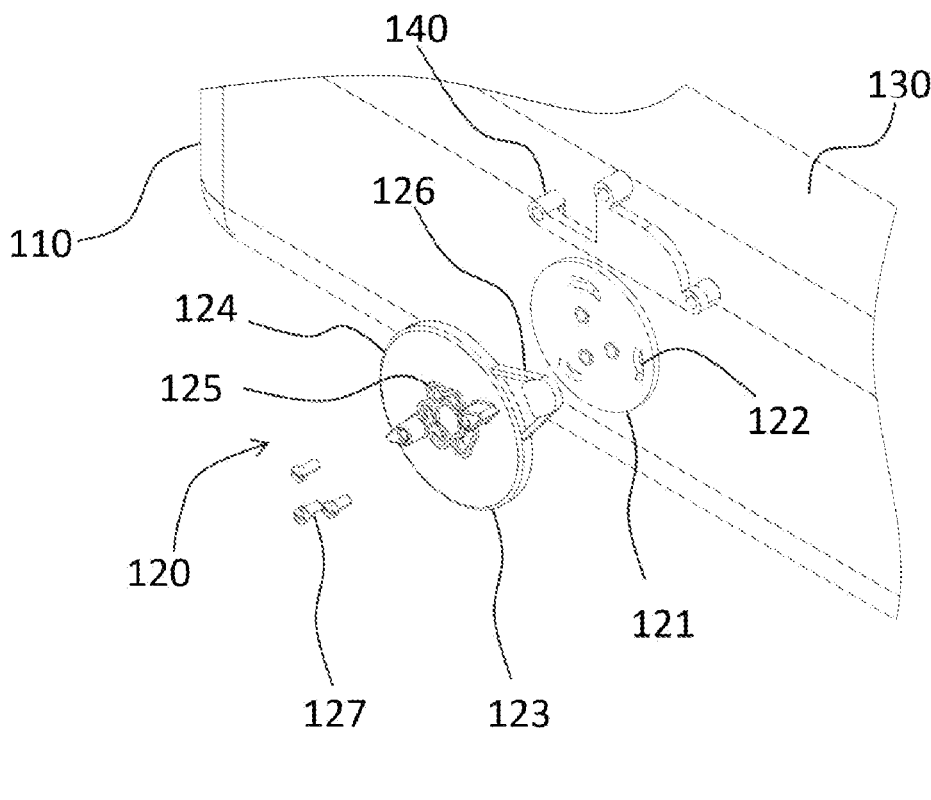
FIG. 11 is an exploded schematic diagram of a switching member.

Following that, please refer to FIG. 10 and FIG. 11, in which: FIG. 10 is a schematic diagram of the protective case according to another embodiment of the present invention, and FIG. 11 is an exploded schematic diagram of a switching member. In this embodiment, the upper cover 130 of the protective case 100 is configured to work with the case body 110, and the upper cover 130 and the case body 110 are connected in a way that allows them to be opened and closed with respect to each other. The protective case 100 includes at least one switching member 120 provided on the case body 110, and the upper cover 130 is provided with at least one engaging member 140 corresponding in position to the switching member 120, wherein the switching member 120 is configured to be locked to the engaging member 140 and thereby lock the upper cover 130 to the case body 110. The number of the at least one switching member 120 and of the at least one engaging member 140 may be plural to meet practical needs; the invention has no limitation in this regard. The switching members 120 in this embodiment are rotary elastic fasteners. When pressed by a first means and then turned, each switching member 120 is unlocked from the corresponding engaging member 140 so that the upper cover 130 can be removed. The first means may be a robotic arm for example to enable automatic opening of the upper cover 130. Each switching member 120 includes a base 121, a rotary fastening element 123, and a plurality of positioning locks 127. Each base 121 is provided on the case body 110 and has a plurality of elastic structures 122 for pushing the corresponding rotary fastening element 123. Each rotary fastening element 123 is mounted on one side of the corresponding base 121 via the corresponding positioning locks 127 and can be turned with respect to the corresponding base 121. Each rotary fastening element 123 has a disc-shaped body 124, a locking hook 126, and a plurality of positioning grooves 125. The positioning grooves 125 of each rotary fastening element 123 are located in the corresponding disc-shaped body 124, with each of the corresponding positioning locks 127 extending through one of the positioning grooves 125 and configured to be fastened/connected to either a first end or a second end of the one of the positioning grooves 125 in order to position the rotary fastening element 123 at a locked position or an unlocked position. Each locking hook 126 protrudes from the periphery of the corresponding disc-shaped body 124 and is configured to be locked to the corresponding engaging member 140 of the upper cover 130.

Figure 12A:
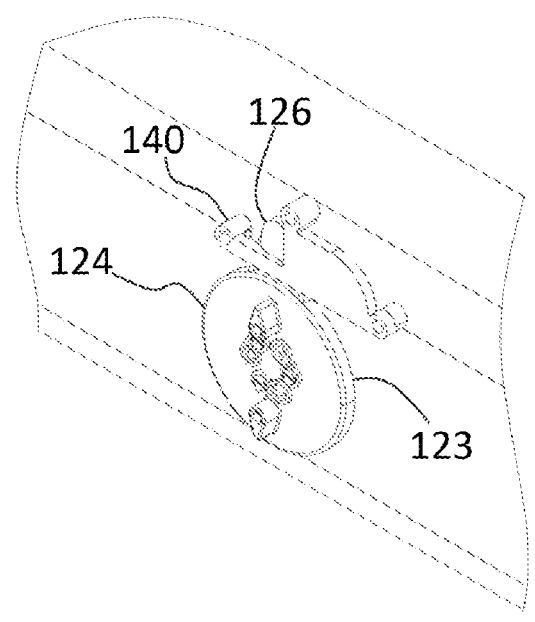
FIG. 12a is a schematic diagram showing a rotary fastening element at the locked position.
Figure 12B:
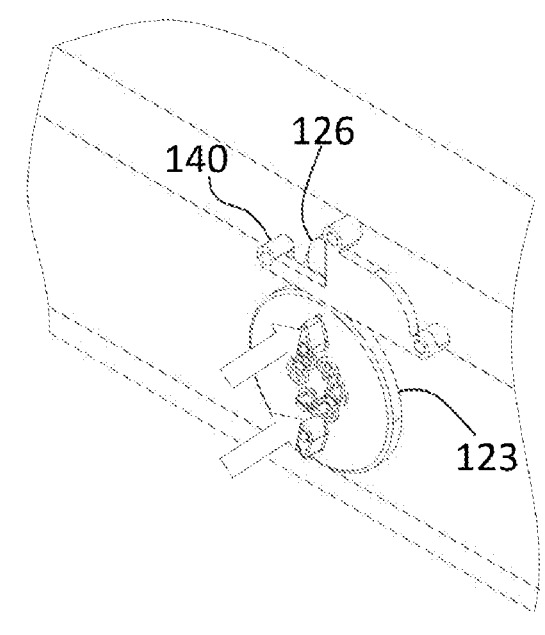
FIG. 12b is a schematic diagram showing the rotary fastening element being pressed.
Figure 12C:
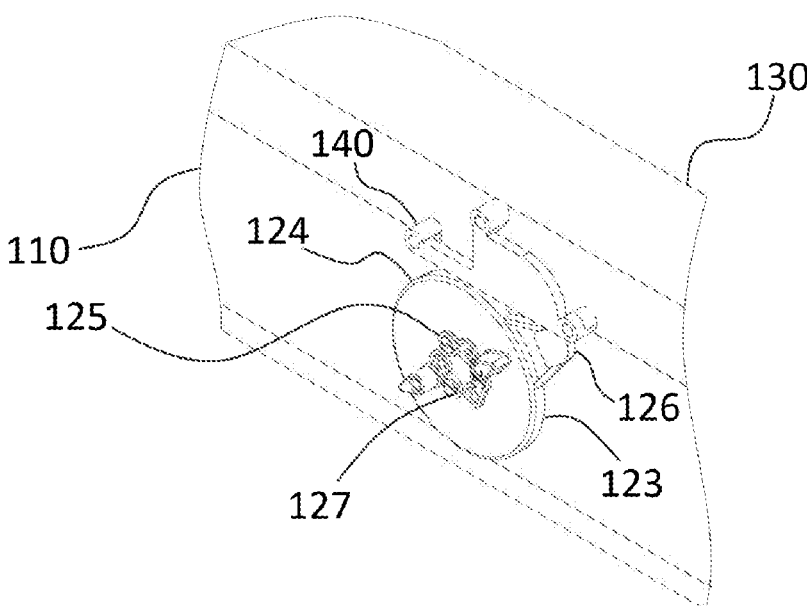
FIG. 12c is a schematic diagram showing the rotary fastening element at the unlocked position.

Please refer to FIG. 12a to FIG. 12c in conjunction with FIG. 11, in which: FIG. 12a is a schematic diagram showing a rotary fastening element at the locked position, FIG. 12b is a schematic diagram showing the rotary fastening element being pressed, and FIG. 12c is a schematic diagram showing the rotary fastening element at the unlocked position. In FIG. 12a, the rotary fastening element 123 is at the locked position, and the disc-shaped body 124 of the rotary fastening element 123 is pushed by the elastic structures 122 of the base 121 such that the locking hook 126 is locked to the engaging member 140. Then, as shown in FIG. 12b, the rotary fastening element 123 is pressed toward the case body 110 by the first means (e.g., the rotary fastening element 123 is subjected to the force applied by automated equipment), and the elastic structures 122 are compressed as a result, with the locking hook 126 moved away from the engaging member 140. Following that, as shown in FIG. 12c, the rotary fastening element 123 is turned to rotate the positioning grooves 125 in the disc-shaped body 124 until each positioning lock 127 is fastened/connected to the second end of the corresponding positioning groove 125. The rotary fastening element 123 in this state is at the unlocked position, with the locking hook 126 completely separated from the engaging member 140. The upper cover 130 can now be removed with automated equipment (e.g., a suction device).

To put the upper cover 130 back in place, the first step may involve using automated equipment to place the upper cover 130 on the case body 110. Then, while the rotary fastening element 123 is at the unlocked position (as shown in FIG. 12c), a force is applied to press the rotary fastening element 123 toward the case body 110 such that the elastic structures 122 are compressed. Next, the rotary fastening element 123 is turned in the opposite direction to rotate the positioning grooves 125 in the disc-shaped body 124 until each positioning lock 127 is fastened/connected to the first end of the corresponding positioning groove 125 again. The rotary fastening element 123 in this state is at the locked position. Once the force applied to press the rotary fastening element 123 is removed, the locking hook 126 is relocked to the engaging member 140 since the elastic structures 122 return to their original position elastically.

The foregoing actuation mechanism of the switching members 120 enables automatic locking and unlocking.

Figure 13:
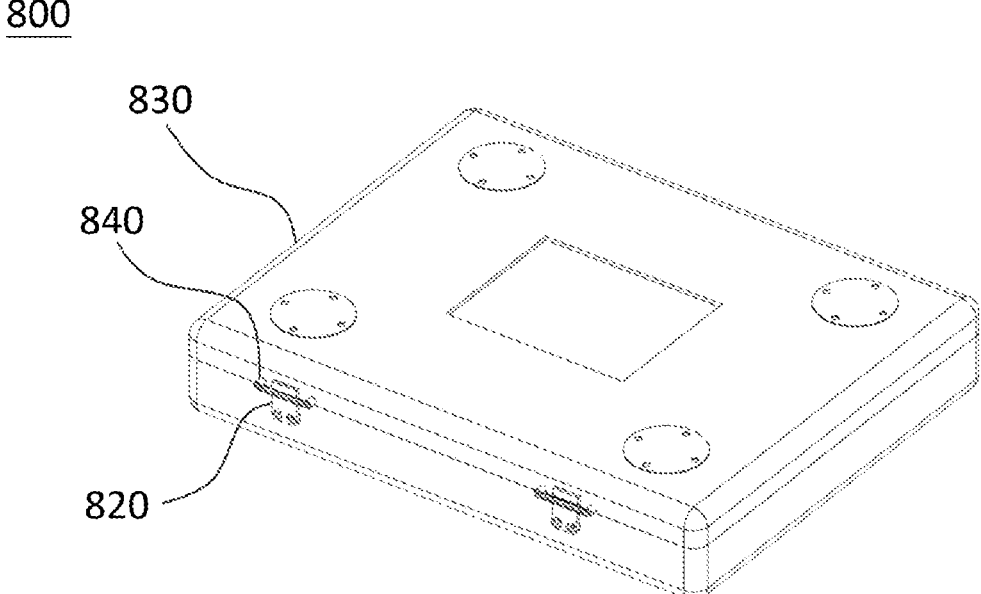
FIG. 13 is a schematic diagram of the protective case according to yet another embodiment of the invention.
Figure 14A:
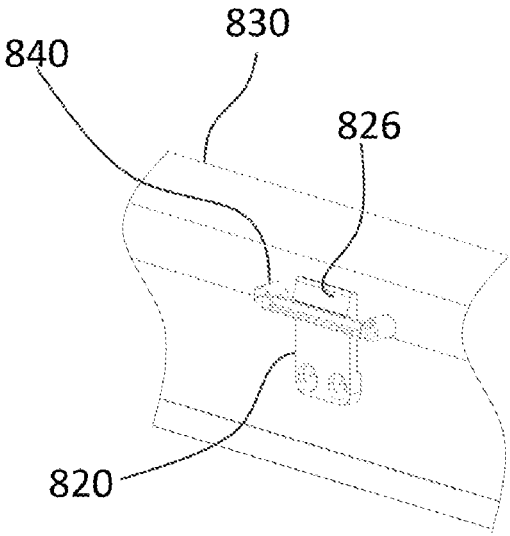
FIG. 14a is a schematic diagram showing a switching member locked to the corresponding engaging member.
Figure 14B:
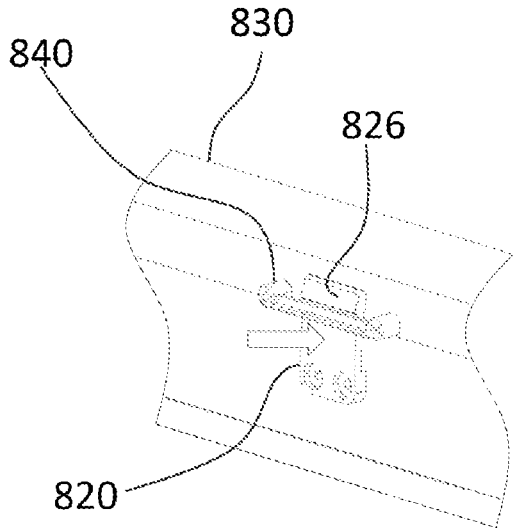
FIG. 14b is a schematic diagram showing the switching member being pressed.

Please refer to FIG. 13, FIG. 14a, and FIG. 14b, in which: FIG. 13 is a schematic diagram of the protective case according to yet another embodiment of the present invention, FIG. 14a is a schematic diagram showing a switching member locked to the corresponding engaging member, and FIG. 14b is a schematic diagram showing the switching member being pressed. The protective case 800 in this embodiment is different from its counterpart in the previous embodiment in the type of the switching members 820. The switching members 820 in this embodiment are push-type elastic fasteners: each switching member 820 can be unlocked from the corresponding engaging member 840 by being pressed by a second means so as to bring the upper cover 830 into a removable state. The second means may be manual gripping for example to facilitate opening and closing of the upper cover 830. Each switching member 820 has a locking hook 826 configured to be locked to the corresponding engaging member 840 of the upper cover 830. To unlock the switching members 820, all that has to be done is to manually apply a force to, and thereby press, the switching members 820 so that each locking hook 826 is moved away from the corresponding engaging member 840 to allow removal of the upper cover 830. Once the upper cover 830 is put back in place, each locking hook 826 will be automatically locked to the corresponding engaging member 840 again.

The actuation mechanism of the switching members 820 not only enables rapid locking and unlocking, but also advantageously simplifies the unlocking steps.

According to the above, the supporting device and protective case disclosed herein for a probe card are so designed that when the protecting cover is placed on the supporting device together with the probe card connected with the protecting cover, the bevel grooves of the supporting device will actuate the fastening members and thereby unfasten the fastening members from the probe card, allowing the probe card and the protecting cover to separate from each other. Unfastening the protecting cover from the probe card by way of the supporting device makes it possible to remove the probe card rapidly and conveniently. Furthermore, when the probe card is removed from the supporting device in different ways (e.g., with a robotic arm or manually), the protecting cover either separates from or is refastened to the probe card to not only prevent the probe card from being damaged by contact or collision that may occur when the probe card is manually picked up and placed, but also facilitate the automation of relevant process flows. In addition, the supporting device is provided in the protective case in a detachable manner and can be rapidly replaced to correspond to different types of probe cards and thereby enhance the flexibility of use. Moreover, the switching members and engaging members provided on the protective case enable automatic locking and unlocking.

While the present invention has been disclosed above through a number of embodiments, those embodiments are not intended to be restrictive of the scope of the invention. A person who is skilled in the art will be able to make various changes or modifications to the disclosed embodiments without departing from the spirit or scope of the invention. The scope of the patent protection sought by the applicant is defined by the appended claims.

What is claimed is:

1. A protective case for a probe card, comprising:
a supporting device for supporting and positioning the probe card, the supporting device having a plurality of quick-release members;
an upper cover; and
a case body, wherein the case body and the upper cover jointly define a receiving space for receiving the supporting device and the probe card, and the case body is provided with a plurality of arrangement grooves arranged to correspond to the quick-release members, each said arrangement groove being configured to mate with a corresponding one of the quick-release members;
wherein each said quick-release member is configured to detachably mate with a corresponding one of the arrangement grooves to detachably fasten the supporting device in the receiving space.

2. The protective case of claim 1, wherein the quick-release members each has an elastic fastening structure, each said quick-release member comprises an abutting member configured to abut against an inner wall of the case body and a pair of shoulders connected to two lateral sides of the abutting member, the case body is further provided with a plurality of pressing fasteners each located at one of the arrangement grooves, and each said pressing fastener is configured to press against and be fastened to a corresponding said pair of shoulders in order to secure the supporting device.

3. The protective case of claim 2, wherein when each said abutting member is moved a predetermined distance away from the inner wall by an applied force, each said pair of shoulders is separated from a corresponding one of the pressing fasteners to bring the supporting device into a detachable state.

4. A supporting device for a probe card, configured to support and position the probe card and be detachably fastened to a protective case, the supporting device being provided with a plurality of bevel grooves, the probe card being connected with a protecting cover, and the protecting cover comprising a plurality of fastening members configured to be fastened to the probe card;
wherein when the protecting cover is placed on the supporting device together with the probe card connected with the protecting cover, the bevel grooves actuate the fastening members and thereby unfasten the fastening members from the probe card to allow the probe card and the protecting cover to separate from each other;
wherein when the probe card placed on the supporting device is removed by a first means, the probe card is separated from the protecting cover, and the protecting cover is left on the supporting device;
wherein when both the protecting cover and the probe card placed on the supporting device are removed by a second means, the fastening members are separated from the bevel grooves and are refastened to the probe card.

5. The supporting device of claim 4, wherein the protecting cover is further configured to connect with a jig after the protecting cover and the probe card are removed by the second means, and the probe card and the protecting cover are separable by the jig, wherein the jig has a main body, and the main body has two lateral sides each formed as an inclined surface for actuating corresponding ones of the fastening members and thereby unfastening the corresponding ones of the fastening members from the probe card.

6. The supporting device of claim 4, wherein the protecting cover comprises a cover body, a sidewall, and a first handle provided on the sidewall, the first handle corresponds to a second handle of the probe card, and the second means is simultaneously removing the protecting cover and the probe card via the second handle and the first handle.

7. The supporting device of claim 4, wherein each said fastening member has a tilted stem, each said bevel groove is configured to interact with the tilted stem of a corresponding one of the fastening members, each said bevel groove has an inclined guide surface forming a first angle with a horizontal plane, each said tilted stem forms a second angle with the horizontal plane, and the second angle is smaller than the first angle.

8. A protective case for a probe card, comprising:

a supporting device for supporting and positioning the probe card, the supporting device having a plurality of quick-release members;

an upper cover;

a case body, wherein the case body and the upper cover jointly define a receiving space for receiving the supporting device and the probe card, and the case body is provided with a plurality of arrangement grooves arranged to correspond to the quick-release members, each said arrangement groove being configured to mate with a corresponding one of the quick-release members, wherein each said quick-release member is configured to detachably mate with a corresponding one of the arrangement grooves to detachably fasten the supporting device in the receiving space; and a switching member provided on the case body, the upper cover being provided with an engaging member corresponding in position to the switching member, wherein the switching member is configured to be locked to the engaging member and thereby lock the upper cover and the case body together.

9. The protective case of claim 8, wherein the switching member is a rotary elastic fastener and is configured to be pressed by a first means and then turned so as to be unlocked from the engaging member, thereby allowing the upper cover to be removed.

10. The protective case of claim 8, wherein the switching member is a push-type elastic fastener and is configured to be pressed by a second means so as to be unlocked from the engaging member, thereby allowing the upper cover to be removed.

*    *    *    *    *